United States Patent
Mozak et al.

(10) Patent No.: US 9,003,246 B2
(45) Date of Patent: *Apr. 7, 2015

(54) FUNCTIONAL MEMORY ARRAY TESTING WITH A TRANSACTION-LEVEL TEST ENGINE

(71) Applicant: Intel Corporation, Santa Clara, CA (US)

(72) Inventors: Christopher P. Mozak, Beaverton, OR (US); Theodore Z. Schoenborn, Portland, OR (US); James M. Shehadi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 157 days.

This patent is subject to a terminal disclaimer.

(21) Appl. No.: 13/631,962

(22) Filed: Sep. 29, 2012

(65) Prior Publication Data

US 2014/0095947 A1    Apr. 3, 2014

(51) Int. Cl.
G11C 29/00   (2006.01)
G11C 29/08   (2006.01)
G11C 29/56   (2006.01)

(52) U.S. Cl.
CPC .............. *G11C 29/08* (2013.01); *G11C 29/56* (2013.01); *G11C 2029/5602* (2013.01)

(58) Field of Classification Search
CPC ........................................................ G11C 29/08
USPC .............................. 714/718, 733, 30; 365/201
See application file for complete search history.

(56) References Cited

U.S. PATENT DOCUMENTS

| | | |
|---|---|---|
| 5,271,020 A | 12/1993 | Marisetty et al. |
| 5,282,272 A | 1/1994 | Guy et al. |
| 5,373,535 A | 12/1994 | Ellis et al. |
| 5,394,557 A | 2/1995 | Ellis |
| 5,410,664 A | 4/1995 | Brooks et al. |
| 5,416,807 A | 5/1995 | Brady et al. |
| 5,436,927 A | 7/1995 | Brady et al. |
| 5,696,940 A | 12/1997 | Liu et al. |
| 5,809,038 A * | 9/1998 | Martin .......................... 714/719 |
| 6,191,713 B1 | 2/2001 | Ellis et al. |
| 6,307,806 B1 | 10/2001 | Tomita et al. |
| 6,553,525 B1 * | 4/2003 | Shephard, III ................ 714/733 |
| 6,747,471 B1 * | 6/2004 | Chen et al. ............... 324/750.05 |
| 6,826,100 B2 | 11/2004 | Ellis et al. |
| 6,839,288 B1 | 1/2005 | Kim et al. |

(Continued)

FOREIGN PATENT DOCUMENTS

WO    WO 2013/002789 A1    1/2013

*Primary Examiner* — Esaw Abraham

(74) *Attorney, Agent, or Firm* — Blakely, Sokoloff, Taylor & Zafman LLP

(57) ABSTRACT

A memory subsystem includes a test engine coupled to a memory controller that can provide memory access transactions to the memory controller, bypassing a memory address decoder. The test engine hardware is configurable for different tests. The test engine identifies a range of addresses through which to iterate a test sequence in response to receiving a software instruction indicating a test to perform. For each iteration of the test, the test engine, via the selected hardware, generates a memory access transaction, selects an address from the range, and sends the transaction to the memory controller. The memory controller schedules memory device commands in response to the transaction, which causes the memory device to execute operations to carry out the transaction.

30 Claims, 8 Drawing Sheets

(56) References Cited

U.S. PATENT DOCUMENTS

| | | | |
|---|---|---|---|
| 6,944,806 B2 * | 9/2005 | Flynn et al. | 714/718 |
| 7,117,416 B1 * | 10/2006 | Fox | 714/733 |
| 7,139,957 B2 | 11/2006 | Querbach et al. | |
| 7,178,076 B1 * | 2/2007 | Zarrineh et al. | 714/733 |
| 7,203,872 B2 | 4/2007 | Frodsham et al. | |
| 7,260,759 B1 * | 8/2007 | Zarrineh et al. | 714/733 |
| 7,313,712 B2 | 12/2007 | Cherukuri et al. | |
| 7,366,964 B2 | 4/2008 | Frodsham et al. | |
| 7,415,032 B2 | 8/2008 | Drottar et al. | |
| 7,464,307 B2 | 12/2008 | Nejedlo et al. | |
| 7,681,093 B2 | 3/2010 | Frodsham et al. | |
| 7,711,878 B2 | 5/2010 | Cherukuri et al. | |
| 7,743,176 B1 * | 6/2010 | Turney et al. | 710/22 |
| 7,746,795 B2 | 6/2010 | Frodsham et al. | |
| 7,886,174 B2 | 2/2011 | Spry et al. | |
| 7,957,428 B2 | 6/2011 | Steinman et al. | |
| 8,195,996 B2 | 6/2012 | Frodsham et al. | |
| 8,225,151 B2 * | 7/2012 | Rajeev et al. | 714/719 |
| 8,250,416 B2 | 8/2012 | Frodsham et al. | |
| 8,331,176 B2 | 12/2012 | Mozak et al. | |
| 8,819,474 B2 | 8/2014 | Schoenborn et al. | |
| 2002/0003049 A1 | 1/2002 | Dabral et al. | |
| 2004/0117708 A1 | 6/2004 | Ellis et al. | |
| 2004/0153850 A1 | 8/2004 | Schoenborn et al. | |
| 2004/0218440 A1 | 11/2004 | Kumar et al. | |
| 2005/0262184 A1 | 11/2005 | Cherukuri et al. | |
| 2007/0220378 A1 | 9/2007 | Mamileti et al. | |
| 2011/0161752 A1 | 6/2011 | Spry et al. | |
| 2013/0031281 A1 | 1/2013 | Feehrer et al. | |
| 2014/0026005 A1 | 1/2014 | Roohparvar et al. | |
| 2014/0032826 A1 | 1/2014 | Lee et al. | |

* cited by examiner

FUNCTIONAL MEMORY ARRAY TESTING WITH A TRANSACTION-LEVEL TEST ENGINE

FIELD

Embodiments of the invention are generally related to memory subsystems, and more particularly to providing deterministic memory testing.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2012, Intel Corporation, All Rights Reserved.

BACKGROUND

Memory devices find ubiquitous use in electronic devices, such as in consumer electronics. Memory devices are typically used to store executable code and data for the runtime operation of the electronic device. Many electronic devices stay operating almost continuously for long periods of time, potentially transferring large amounts of data in and out of the memory devices. Thus, it is important that the memory devices perform according to design expectations. However, memory devices are subject to failure from design issues or manufacturing inconsistencies. The failures can show up right after manufacturing as well as in operation of the devices.

Memory testing is used to detect abnormalities or other unexpected behavior in the memory devices. Some memory tests are subtle I/O (input/output) failures or failures with memory array cells. Some I/O failures usually require a specific combination of power supply noise, crosstalk, and ISI (inter-symbol interference). The ISI could come from either interference due to previous unit intervals (UIs) of a current burst, or from prior bursts (for example, due to turnaround time on the bus). As a result, fully testing the I/O can be very difficult due to the specific sequences required to reliably create the necessary conditions for failure.

Similarly, failure in the memory device arrays can be very difficult to reliably create. Many cell failures only occur under the condition of very specific access patterns. Failures in the memory array often require triggering a specific corner case that affects marginal conditions of a memory device circuit. Some failures may only be detectable when data is repeatedly read and/or written to specific address locations, and some only in high-bandwidth situations.

Traditional testing solutions used testing mechanisms that were either fixed function hardware finite state machines (FSMs) or to execute a test in software. Software solutions suffer at least the problem of the software needing to go through multiple levels of processing and scheduling, which can result in out-of-order execution of the software test operations. For example, the software instructions can be processed and scheduled through the core (e.g., the processor(s)), the uncore (e.g., system architecture elements that connect the processor cores), and memory controller. The software instructions are also subject to filtering in the various cache levels of the processor(s). Thus, the instructions go through too many levels of processing to guarantee the operation of the test, and cannot precisely target what areas of the memory device are affected when desired.

Hardware FSMs can operate much closer to the memory controller and avoid many of the issues associated with many levels of processing. However, traditional hardware FSMs are very fixed function machines that execute a single test type. Traditional hardware FSMs cannot adapt to different testing needs. Having hardware that can perform all the testing desired would be prohibitively expensive in terms of cost and space. Additionally, traditional hardware FSMs operate at the memory device command level, injecting the specific commands they want the memory devices to execute.

Furthermore, whether with software testing mechanisms or hardware FSMs, traditional tests have not been able to produce the repeated reading and/or writing necessary to test for certain types of failures. Certain failure conditions require certain test conditions that traditional testing cannot produce. Trying to implement a software test would not reliably test the conditions necessary to detect a failure. Assuming the conditions could be produced by hardware FSMs, the testing could require the use of multiple hardware FSMs with coordinated operation. Such a configuration would be both expensive and complex.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
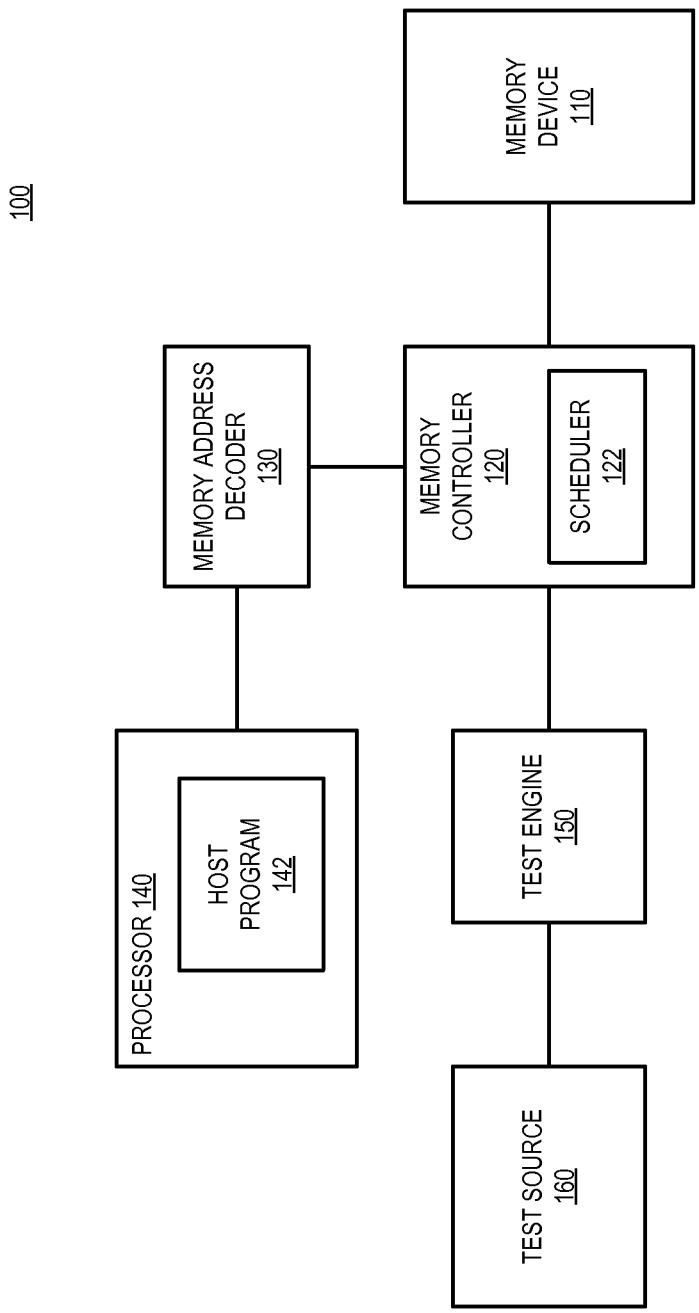
FIG. 1 is a block diagram of an embodiment of a system having a test engine that provides testing on a transaction level.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem includes a test engine coupled to a memory controller that can provide memory access transactions to the memory controller, bypassing a memory address decoder. The test engine hardware is configurable for different tests. The test engine identifies a range of addresses through which to iterate a test sequence in response to receiving a software instruction indicating a test to perform. For each iteration of the test, the test engine, via the selected hardware, generates a memory access transaction, selects an address from the range, and sends the transaction to the memory controller. Thus, the test engine provides testing at the transaction level of operation. The memory controller schedules memory device commands in response to the transaction, which causes the memory device to execute operations to carry out the transaction. The transactions are thus sent through the normal processing of the memory controller, and test the actual behavior of the memory subsystem. The transactions cause deterministic behavior in the memory device because the transactions are executed as provided, while at the same time testing the actual operation of the device.

The test engine as described herein can inject transactions (e.g., read, write, maintenance command) directly into the memory controller, bypassing a memory address decoder. Passing the transactions to the memory controller after the memory address decoder enables the test engine to operate at the level of specific memory address (e.g., rank, bank, row, and column) and create precisely targeted tests that focus on specific locations in the memory device. However, because the test engine operates on the transaction level, the test operations (embodied in the transactions created) still go through the normal memory controller and scheduler. The memory controller generates specific memory device commands from the transactions.

In one embodiment, consider that a transaction indicates to read a cacheline from memory. Depending on the current state of memory, such a read may require a given page of memory to be precharged, a new page activated based on the row address of the read command, and the actual read command to be issued. The precharging, activating, and reading is supposed to take place with the appropriate timing per a memory protocol for the memory device. In another embodiment, consider that a transaction indicates a read where the appropriate page in memory is already open, which may only require a read command to the appropriate column to access the data. In general, the memory access transactions indicate to the memory controller what to do, but not how to do it. The memory controller controls tracking the current state of memory and how to access a location based on the current state of memory. Thus, the memory controller determines how to Activate and/or Precharge the proper pages, issue the CAS/RAS (column address strobe or signal/row address strobe or signal) command, and obey all relevant timing related to accessing the memory device.

By operating at the transaction level and allowing the memory controller to generate the memory device commands and timing, the testing is easier to write, and yet at the same time more accurately reflects how the memory subsystem operates (it is "correct by construction"). The test engine cannot do anything that the memory controller would not normally do, or request the memory device to perform an operation that would be considered illegal under access protocol(s). Such capability is in contrast to both the traditional software testing and hardware FSMs used in testing. The "correct by construction" nature of the test engine described herein gives increased confidence that any failures detected by the test engine are real failures and not simply the result of incorrect test setup.

In one embodiment, the test engine is configured by software to output a specific sequence of transaction, walking through different address ranges with write and/or read transactions. The software can be run either locally at the host device in which the memory controller and memory device are found (e.g., through a core or microcontroller on the platform) or remotely (e.g., by a remote host via a debug port). In one embodiment, the test engine supports both local and remote software execution to provide a test instruction. Remote host testing can provide remote validation during debug or during post-manufacturing testing. Local testing can be performed for self-testing purposes, for example, by a BIOS (basic input/output system) or operating system (OS) verification software.

In one embodiment, the test engine is to translate a generic memory test command string written in a standard testing notation into something executable by the memory subsystem hardware. One common testing notation is van de Goor's notation. The translation of the testing notation can be performed by software that is either run locally through a Core or microcontroller, or by a remote host through a debug port. In one embodiment, the software can directly read the text description of the test and translate it into various control register settings that are used to configure the hardware test engine.

Examples of van de Goor's March C test instructions can include the following commands. The command ˆ(wd)# is a command to Write data to all memory locations walking up through the addresses. The command ˆ(rd,wi)# is a command to Read data and Write inverse data for all memory locations, walking up through the addresses. The command v(ri,wd)# is a command to Read inverse data and Write data for all memory locations, walking down through the addresses. The command v(rd)# is a command to Read data for all memory locations, walking down through the addresses. Other instructions are possible. Other features of the notation include what type of data (e.g., row strips, column stripes, or checkerboard) to use in the test, what (rank, bank, row, column) order to walk through the memory, and what portion of memory to test.

In one embodiment, a testing notation indicates a repeat sequence. For example, in van de Goor's notation, each parenthesis indicates walking through all of memory addresses. Such an instruction can be translated directly to a single test, executed in iterative fashion by hardware resources of the test engine. In one embodiment, the test engine is dynamically reprogrammable (e.g., between sequence repeats, such as between parenthetical statements) to execute the specific test sequence. Dynamically reprogramming the test engine hardware can reduce hardware cost by reusing the hardware resources. The overhead involved in programming or configuring the hardware can be considered small relative to the fact that each sequence can generate upwards of more than 1 billion commands (e.g., to iterate through all memory locations).

In one embodiment, the test engine hardware is divided into sequence and subsequence loops. An example of the separation of the loops can be seen in the pseudo code example of Table 1 below. In table 1, a Sequence executes (iterates) a number of times designated by NumSequence. For each iteration of the Sequence, a subsequence, SubSeq, executes (iterates) for a number of times designated by SubSequence. It will be understood that the pseudo code specifically indicates "Increment Address," which can refer to incrementing positively (i.e., incrementing) or negatively (i.e., decrementing) the addresses. Additionally, addresses could be changed for either rank, bank, row, or column, or some combination. In one embodiment, the test engine hardware can support one sequence loop and eight subsequence loops, although different configurations are possible, at least partially dependent on hardware costs.

TABLE 1

Pseudo code example of test sequence and subsequence

Foreach Sequence in NumSequence:
    Foreach SubSeq in each SubSequence:
        Increment Address based on limits/carries defined in Sequence
        Issue one or more transactions based on SubSeq
        If Last Command of SubSeq: Continue to next SubSeq
        If Last Command of Sequence: end test As described herein, the test engine is deterministic and controllable. In one embodiment, the test engine is dynamically configurable. The determinism refers to an expectation that repeatedly running the same test will generate exactly the same sequence of activity on the memory command bus and data bus in a cycle-accurate manner. The controllability refers to being able to control the behavior of the system with precision (e.g., causing specific behavior at specific cycles). The test engine creates different memory conditions with the transactions created and passed to the memory controller. In one embodiment, the test engine enables support to synchronize with power down modes, refreshes, ZQ calibration, and maintenance commands. The synchronization can enable the test engine to place the memory controller in a deterministic state prior to starting a test.

In one embodiment, the test engine resets the memory controller prior to passing a particular transaction, or prior to beginning a test. Resetting the memory controller can be or include resetting the free running counters to place the memory controller in a deterministic state. The reset signal can be based on a test event signal from the test engine. Based on the desired functionality, the reset signal could reset the counters at the start of the test, an important intermediate milestone in the test, or continuously reset during a specific portion of the test. Furthermore, to provide controllability, these counters can be reset with a programmable value to allow additional flexibility in precisely placing when a particular event (e.g., a refresh) will take place during a test.

The test engine as described herein can provide a memory test in a highly specific manner to detect subtle I/O or memory array cell failures. The test engine provides very tight control over the specific sequence of commands that reach the memory device. The test engine generates memory access transactions, which can identify specific memory device commands in a specific order, which are scheduled by the memory controller as provided by the test engine. Thus, the test engine can provide memory device commands including ACT (Activate), RD (Read), WR (Write), PRE (Precharge), as well as providing Power Mode commands.

In one embodiment, the test engine is dynamically configurable, which can allow it to test for multiple different worst case scenarios to more fully validate I/O performance in the memory subsystem. The test engine can be adapted to provide different command patterns to determine worst case performance, such as: continuous bursts of only read or only write data to create significant ISI and crosstalk; turnaround tests that switch from Read/Write on Rank A to Read/Write on Rank B; memory reads/writes with minimum timing to clock enable (CKE) power down; Activates or Refreshes creating excessive power supply noise in DRAM; near-end crosstalk between writing to the command bus and reading from the data bus; near-end crosstalk between writing on a Channel A data bus and reading on a Channel B data bus; or, other test scenarios.

The test engine can provide specific patterns that test specific cases of memory device circuit marginality. For example, the test engine can be configured to provide a test requiring repeatedly Activating and/or Precharging a row in sequence to stress out the wordline and charge pump circuits. In another example, the test engine can be configured to provide a test to write a specific row or column, and then repeatedly read and/or write the adjacent rows/columns to create coupling and/or leakage paths that compromise the original cell's value. In one embodiment, the test can return to the original cell address a predefined amount of time later to read if the cell's value was maintained to ensure cell retention time. Such a retention time test can be run with either refresh enabled or disabled. A retention time test with refresh disabled can provide a high level or determinism given the test directly controls the amount of time between the cell being written and read back. Between the write command and the read command, the test engine can activate, read, write, or precharge nearby cells in the array to create different stress patterns. It should be understood that, although these are described as separate tests, these different types of stress access patterns can be combined together to create worst case behavior testing. As described herein, the test engine can provide a physical memory device address (e.g., identifying rank, bank, row, and column). Thus, the test engine can create precisely targeted, high bandwidth tests.

As described herein, a test engine can enable full testing of the I/O for training (I/O performance, memory power), electrical validation, system validation, or self-test or repair (I/O or memory device cell). For each of these testing scenarios and others, the test engine can create deterministic traffic. The determinism of the traffic can include determinism in cases such as refresh, ZQ calibration, or power down modes.

The test engine as described herein can be used to test memory devices. Any memory subsystem that uses a memory controller with a scheduler or equivalent logic can implement at least one embodiment of the test engine. Reference made herein to memory devices can include different memory types. For example, memory subsystems commonly use DRAM, which is one example of a memory devices as described herein. Thus, the test engine described herein is compatible with any of a number of memory technologies, such as DDR4 (dual data rate version 4, specification in development as of the filing of this application), LPDDR4 (low power dual data rate version 4, specification in development as of the filing of this application), WIDEIO (specification in development as of the filing of this application), and others.

It will be understood that in a memory device, rows that are physically adjacent can often be logically labeled differently from one manufacturer to another. Similarly, columns that are physically adjacent can be logically labeled differently from one manufacturer to another. Typically a manufacturer maps logically adjacent rows and columns of memory by a physical address offset, and the offsets can be different among different manufacturers. The offsets are not necessarily the same for rows and columns. For example, an N-bit address can be used to access a particular row of the memory. In the simplest case, the adjacent row can be accessed by toggling AddressBit[0]. However, in other implementations, the memory device can be physically organized differently such that AddressBit[x] indicates the adjacent row. In still other implementations, a combination of several bits is combined in a hashing function to find the adjacent row. By providing bit swizzling and hashing functions in the hardware, the test engine can remap the logical test engine address to a physical memory device addresses to ensure the test is accessing the physical adjacent rows and/or columns for tests that rely on row/column adjacency. Accessing the array in a specific order based on physical organization may be critical to finding certain classes of failures.

The memory device itself is configured to determine how to map access requests to the physical memory resources. Memory controllers are generally designed to be compatible with many different types of memory devices, and so they are generally not designed specifically with respect to any particular manufacturer's device. Thus, memory controllers do not traditionally have logic or information to indicate what rows are physically adjacent. In one embodiment, the test engine can be configured with logic that takes into account the specific offsets of a particular memory device. In one embodiment, the test engine can be specific to a particular memory device. In one embodiment, the test engine can be generic with respect to multiple different memory devices.

FIG. 1 is a block diagram of an embodiment of a system having a test engine that provides testing on a transaction level. System 100 includes components of a memory subsystem (memory device 110, memory controller 120, and memory address decoder 130) coupled to a test engine (coupled to memory controller 120) and a host processor (coupled to memory address decoder 130). Test engine enables deterministic memory testing in system 100.

Memory device 110 represents any type of memory device with addressable memory locations. Memory address decoder 130 receives a memory access request from processor 140, and determines a specific memory address to fulfill the request. It will be understood that processor 140 may not be directly coupled to memory address decoder 130. However, access requests in system 100 are generally all create by processor 140, and pass through memory address decoder 130 for resolution of a specific physical location of memory device 110 as identified by a specific address. Host program 142 represents any one or more software processes executed by processor 140 from which a memory access request can be generated.

Memory address decoder 130 generates memory access transactions to fulfill the access requests. Memory controller 120 receives the memory access transactions and determines what specific memory device commands to execute to comply with protocol and design configuration of memory device 110 to fulfill the access requests. Memory controller 120 schedules the specific memory device commands with scheduler 122. In one embodiment, memory controller 120 performs out-of-order scheduling, which means that memory access transactions can be resolved into multiple memory device commands, and executed in an order selected by memory controller 120 instead of an order in which they are passed by memory address decoder 130. Memory address decoder 130 can potentially generate the transactions out of order from the requests received from host processor 140. Thus, there is no guarantee of the order of execution of memory access requests made through memory address decoder 130.

Test engine 150 bypasses memory address decoder 130 and generates transaction-level access requests for memory controller 120 to schedule. It will be understood that test engine 150 does not bypass the scheduling path of memory controller 120. Like memory address decoder 130, test engine 150 generates and passes memory access transactions with specific addresses.

Test engine 150 receives one or more memory test instructions or software commands from test source 160. Test source 160 can be any sources of a number of different sources. For example, in the case of a production-level test or during debugging, a test fixture or other external (which can also be referred to as remote) processor or system can send a test instruction via a debug port or other interface to test engine 150. The external system can be referred to as a remote test administrator system, including a processor to issue the instructions. Alternatively, test source 160 could be a microcontroller local to a host computing platform of system 100 (e.g., a "motherboard" or other platform on which processor 140 and its peripheral interfaces reside). Test source 160 could be a test system coupled to a peripheral bus of system 100. In one embodiment, test source 160 is a BIOS of system 100.

In one embodiment, test engine 150 is configurable to execute different memory tests. Thus, test source 160 can provide one or more instructions to cause test engine 150 to generate one or more transactions consistent with one memory test, and then provide one or more different instructions to cause test engine 150 to generate one or more transactions consistent with a different memory test. Responsive to receiving a software command from test source 160, test engine 150 generates the one or more transactions to execute a test indicated by test source 160. Test engine 150 passes the transaction to memory controller 120, which in turn, schedules one or more memory device commands to memory device 110. Memory device 110 will thus carry out the transaction provided by test engine 150.

In one embodiment, test engine 150 is implemented as a hardware finite state machine (FSM). Test engine 150 can be a dynamically programmable hardware FSM. The ability of test engine 150 to provide deterministic testing via the transaction-level testing enables running various different test scenarios. Examples of different test cases can include the following.

In one embodiment, test engine 150 performs a turnaround time test. A turnaround time test detects issues related to how long it takes the system to switch at speed between different physical devices of the memory. For example, if commands are issued too close together, a new command can corrupt a command already on the line that has not been fully received and processed by the target device. In one embodiment, test engine 150 allows for walking across a programmable sequence of ranks and/or banks Walking across the sequence allows testing of different combinations of read and/or writes to different ranks, while hitting all combinations of turnarounds. In one embodiment, test engine 150 tests minimum specified turnaround times to provide the highest stress timing that schedule 122 allows.

Table 2 illustrates one example of an embodiment of a test sequence that walks across all ranks in a system with four ranks, hitting various combinations of write-write or read-read. Such a test can test, for example, different DIMM turnarounds. Different combinations may be of interest for different failure modes under test. It will be understood that the test operates from left to right, and could be extended out further to the right. While write-write and read-read combinations are illustrated, similar sequences are possible for write-read and/or read-write. In one embodiment, test engine 150 walks across ranks in a linear order (referred to as a logical rank), and is consistent in walking across the same logical rank. Thus, test engine can walk across all ranks in a logical order. In one embodiment, test engine 150 includes a fully programmable mapping between the logical rank and physical rank, which enables it to issue transactions targeted to desired physical memory locations. It will be understood that scheduler 122 sees the physical ranks, but would typically not see the logical rank. Test engine 150 can thus cover an arbitrary sequence of ranks in a memory test. It will be understood that a similar test could be programmed to provide a physical bank mapping, which can map between logical bank and physical bank. Thus, the test engine could perform a walk-through test on a sequence of banks.

150 can cover different types of ZQ calibration as supported by a specification of memory device 110 (for example, long versus short).

In one embodiment, test engine 150 performs a register test, such as a Mode Register write (MRW) or a Mode Register read (MRR). In one embodiment, test engine 150 can inject mode register writes and/or reads into scheduler 122 to cover any possible combination of these commands with other commands. Providing register transactions from test engine 150 can also provide coverage for functional modes that may require doing register read and/or write commands.

In one embodiment, test engine 150 performs an error recovery test. It will be understood that because test engine

TABLE 2

Example turnaround testing with logic rank

| Rank Order | 0 2 1 3 0 3 1 2 | | | | | | | | | | | | | | | |
|---|---|---|---|---|---|---|---|---|---|---|---|---|---|---|---|---|
| Operation | W | W | W | W | W | W | W | W | R | R | R | R | R | R | R | R |
| Rank | 0 | 2 | 1 | 3 | 0 | 3 | 1 | 2 | 0 | 2 | 1 | 3 | 0 | 3 | 1 | 2 |
| Turnaround | | 01 | 21 | 13 | 30 | 03 | 31 | 12 | | 01 | 21 | 13 | 30 | 03 | 31 | 12 |

In one embodiment, part of generating the memory test includes performing a logical-to-physical address mapping, mapping the logical address. The logical-to-physical address mapping can include logical column address to a physical column address, logical row address to physical row address, logical rank address to physical rank address, logical bank address to physical bank address, or a combination of these. The mapping can be achieved via swizzling different bits, combining multiple bits together in a hashing function, the use of a fully programmable mapping table on all or a subset of the bits, or some other mechanism to map addresses.

In one embodiment, test engine 150 performs a power down mode test. In one embodiment, test engine 150 provides the ability to insert a programmable wait time at any point during a test. By adjusting the wait time and scheduler parameters, test engine 150 can enable memory controller 120 to enter all possible power down modes including APD (automatic power down), PPD (precharged power down), Self-Refresh, and/or other internal power down modes such as package C-states. Thus, test engine 150 can target testing to cover entering and exiting power down modes with the most aggressive possible timing, while also providing programmable traffic around the enter and/or exit.

In one embodiment, test engine 150 performs a refresh test. In one embodiment, test engine 150 injects periodic refreshes into scheduler 122 as needed to either maintain memory device cell contents, or to create worst case power supply noise. The refreshes consume significant dI/dt or current surges, which is known to cause power supply noise. Test engine 150 can inject the refreshes at a deterministic, programmable time relative to the start of the test. In one embodiment, test engine 150 can cover different types of refreshes as supported by memory device 110 (for example, some memory device specifications allow per bank refreshes, or all rank refreshes, as well as others).

In one embodiment, test engine 150 performs a test of ZQ calibration. In one embodiment, test engine 150 can inject periodic ZQ calibration commands into scheduler 122 as needed to maintain the ZQ compensation and/or test any potential issues with variation in the termination resistor calibration of memory device 110. Test engine 150 can inject ZQ calibration commands at a deterministic, programmable time relative to the start of the test. In one embodiment, test engine 150 passes access transactions to memory controller 120 to be scheduled by scheduler 122, error recovery in system 100 will occur as in runtime operation of system 100. Thus, in the case of an error, such as parity error or CRC (cyclic redundancy check) error in memory device 110, scheduler 122 can respond as in operation, such as retrying transactions.

It will be understood that the different tests for ZQ calibration, registers, power down, or error recovery can be combined with other types of tests, as well as with each other. Other test scenarios are possible. In general, test engine 150 can enable full testing of the I/O for training (e.g., I/O performance, memory power), electrical validation, system validation, and/or self-test or repair (e.g., I/O or memory cell).

Figure 2:
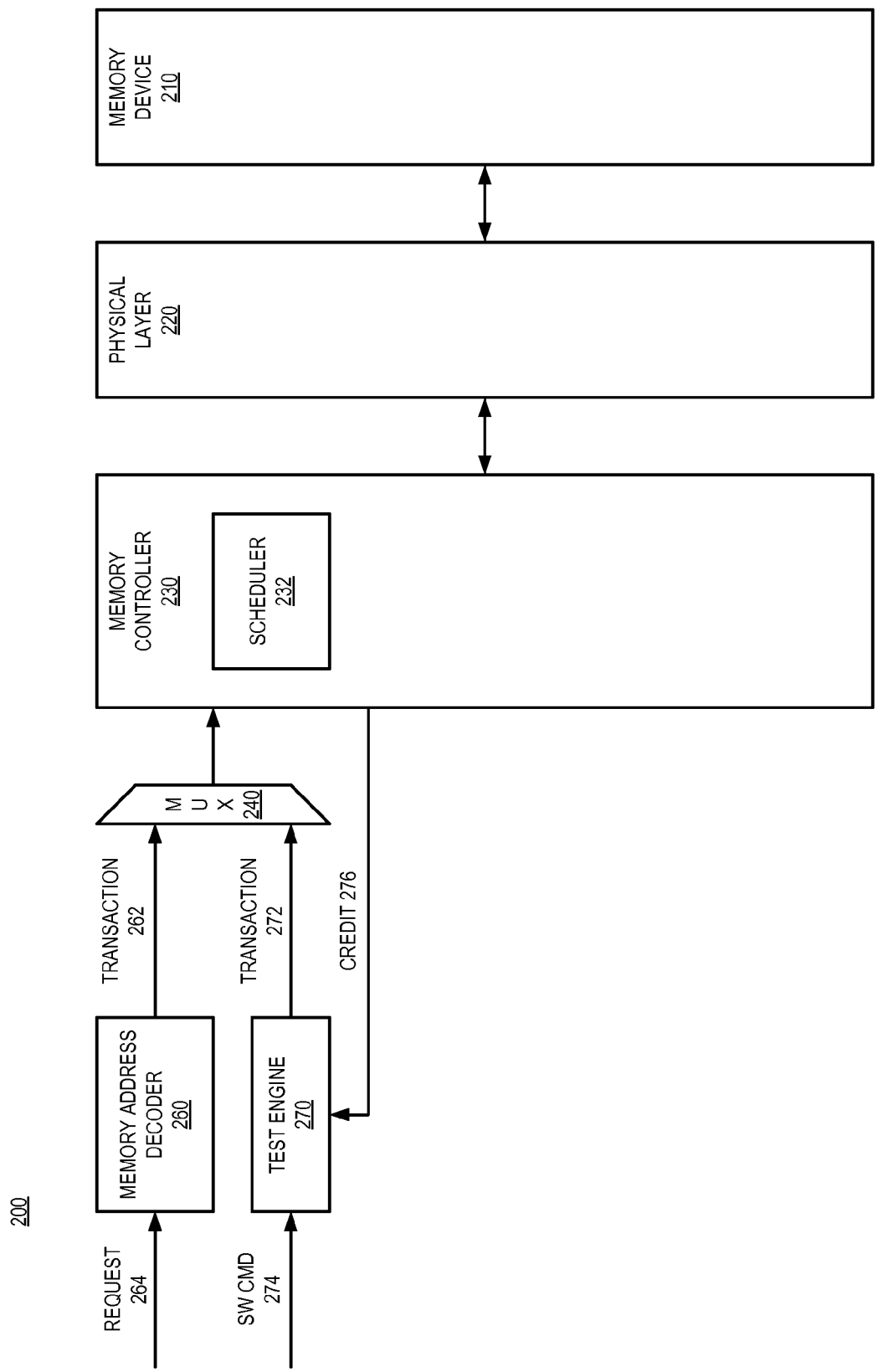
FIG. 2 is a block diagram of an embodiment of a system having a test engine that provides transaction-level testing multiplexed to a memory controller with a memory address decoder.

FIG. 2 is a block diagram of an embodiment of a system having a test engine that provides transaction-level testing multiplexed to a memory controller with a memory address decoder. System 200 is one example of an embodiment of a system with a test engine in accordance with any embodiment described herein, such as system 100 of FIG. 1. Memory device 210 stores data and/or instructions for execution by a processor (not specifically shown). The operation of memory device 210 is tested by test engine 270.

Physical layer 220 provides the architecture to connect multiple memory devices 210 to memory controller 230. Physical layer 220 can include registers, physical buses, and other components of a memory device. For example, physical layer 220 can include components of a dual inline memory module (DIMM), which can include multiple individual DRAMs.

Memory controller 230 is a memory controller in accordance with any embodiment described herein, and includes scheduler 232. Memory controller 230 generates memory device commands for memory device 210 to execute. Scheduler 232 schedules the memory device commands generated in response to the memory access transactions received at memory controller 230.

Memory address decoder 260 provides a standard path for memory requests to reach memory controller 230, for example, from a host processor. Memory address decoder 260 receives request 264 from a source such as the host processor. Request 264 generally includes an access command and address information. The address can be a logical address, which does not identify the actual physical address of the memory location(s) to which the memory access is directed. Memory address decoder 260 includes logic that enables it to resolve the physical address from the virtual address information to create transaction 262. In one embodiment, transaction 262 includes a command identifier, and identifies the specific rank, bank row, and column for the command.

System 200 includes test engine 270, which receives software command 274 from a test source, and generates memory access transactions 272 for scheduling by memory controller 230 and execution by memory device 210. In one embodiment, transactions 272 are of the same form as transactions 262, with a command identifier (e.g., a read identifier or write identifier), and identifier for the specific rank, bank row, and column for the command. In one embodiment, memory controller 230 generates credit 276 as feedback to test engine 270. Memory controller 230 can use credit 276 to provide indicators of the timing of processing transaction 272. Thus, for example, memory controller 230 can indicate when a transaction has been processed.

In one embodiment, test engine 270 uses credit 276 to control the determinism of the testing. For example, test engine 270 can use a single credit policy in that it will only send out one transaction or command at a time. In one embodiment, test engine 270 waits to send out a subsequent transaction until memory controller 230 returns credit 276 indicating the first transaction has been issued. Thus, even if scheduler 232 uses out of order scheduling or just in time scheduling, test engine 270 can send one transaction at a time, which ensures that scheduler 232 will not reorder the test.

It will be understood that a credit return generally could be accomplished in different ways, depending on the memory controller architecture and specific sequences of transactions or commands. In one embodiment, memory controller 230 returns credit 276 after a Read or Write CAS command is generated. Alternatively, memory controller 230 can generate credit 276 from an Activate command, or other memory device command or internal scheduler event. Test engine 270 could simply wait a period of time between sending transactions, without the need for credit 276. However, in such an implementation a full bandwidth deterministic test of the memory device may not be possible.

In one embodiment, a sophisticated feedback mechanism is used between memory controller 230 and test engine 270. For example, feedback can be provided under certain circumstances for specific events (e.g., internal scheduler events), and/or feedback specific to a physical memory location (e.g., per rank), and/or some other mechanism. With a more sophisticated credit return policies, test engine 270 can generate transactions in parallel for different portions of the memory, or different conditions to affect memory device 210, and thus, provide a higher bandwidth test of memory device 210. Such a higher bandwidth test can test the highest possible memory bandwidth allowable by a specification for memory device 210 and/or allowable by the design or specification of memory controller 230.

In one embodiment, system 100 includes multiplexer 240 or equivalent logic (e.g., logic within memory controller 230) to select between transaction 262 of memory address decoder 260 or transaction 272 of test engine 270. Although the expression "multiplexed" may be used, it will be understood that if the operation of memory address decoder is temporarily suspended, and/or higher-level operations at the processor level are suspended to prevent issuing of memory access requests, transaction 272 can be the only input available during testing. Thus, in one embodiment, mux 240 can be implemented as a simple buffer that can be written by either memory address decoder 260 or test engine 270. Alternatively, mux 240 can be a multiplexer that selects between transaction 262 and transaction 272 responsive to a set signal (not explicitly shown). Such a signal could be generated, for example, by test engine 270 or an external signal controllable by the test source. In one embodiment, such a set signal could be used as a security feature to prevent access to the test engine by malicious code that could be trying to access protected memory contents through the test engine, which it would otherwise not have access to. Thus, selecting the multiplexer can be understood in one embodiment as providing security to the test engine.

Figure 3:
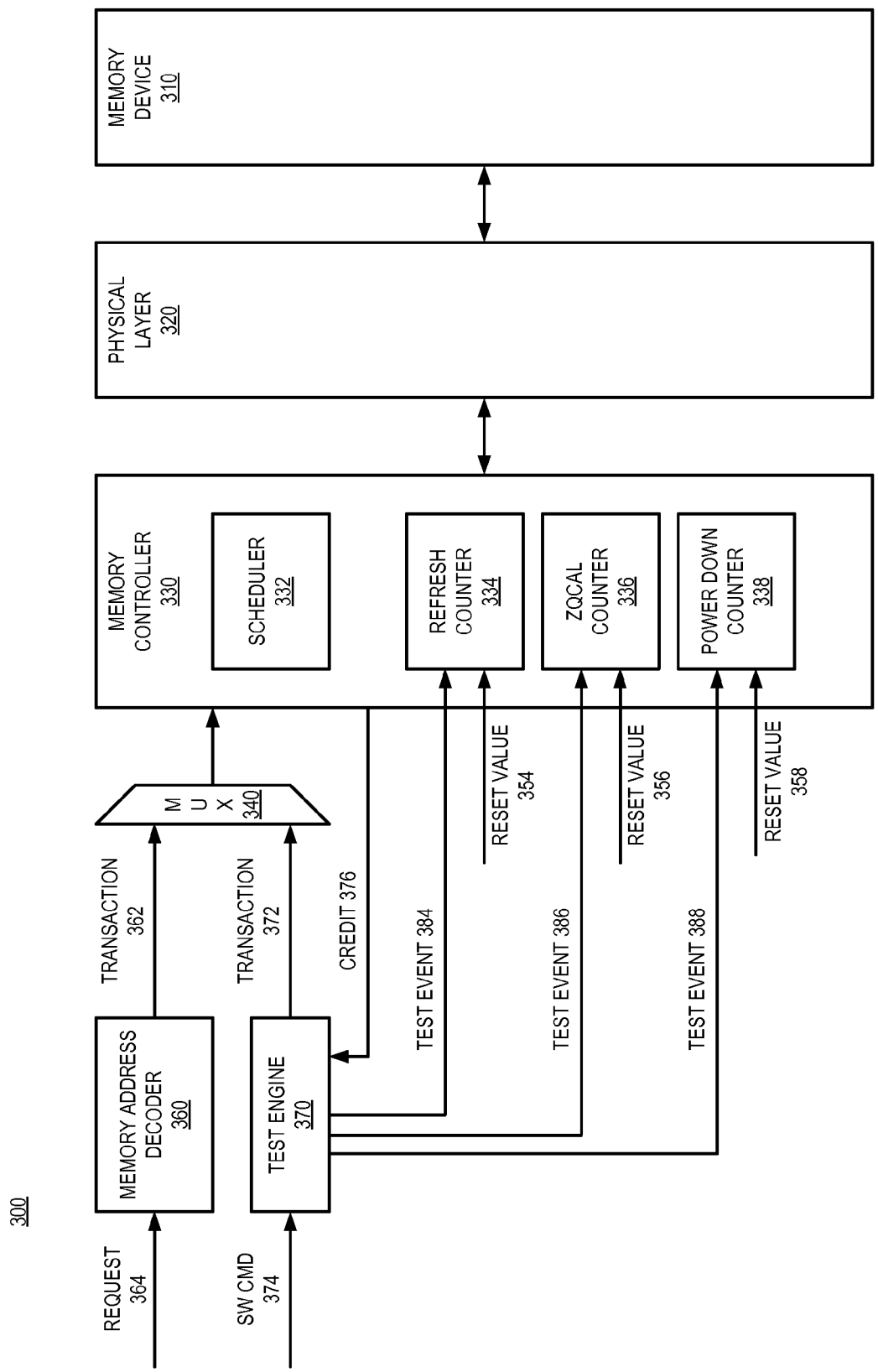
FIG. 3 is a block diagram of an embodiment of a system having a test engine that provides transaction-level testing including the ability to reset memory controller counters.

FIG. 3 is a block diagram of an embodiment of a system having a test engine that provides transaction-level testing including the ability to reset memory controller counters. System 300 is one example of an embodiment of a system with a test engine in accordance with any embodiment described herein, such as system 100 or system 200. Memory device 310 stores data and/or instructions for execution by a processor. The operation of memory device 310 is tested by test engine 370.

System 300 includes memory device 310, physical layer 320, memory address decoder 360, and test engine 370. Each component corresponds to a component of system 200, and the description above with respect to those components applies to system 300. In one embodiment, system 300 includes mux 340, which can be the same as mux 240 of system 200 discussed above. Memory address decoder 360 receives request 364, and generates transaction 362 in response to the request, where transaction 362 includes specific address information. Test engine 370 receives software command 374, and in response to the instruction generates one or more transactions 372. In one embodiment, system 300 utilizes credit 376 to provide feedback from memory controller 330 to test engine 370.

Memory controller 330 includes scheduler 332, which can be similar to scheduler 232 of system 200. Memory controller 330 can use credit 376 to provide indicators of the timing of processing transaction 372, and for example, can indicate when a transaction has been processed.

In one embodiment, memory controller 330 includes one or more counters. Examples include, but are not limited by, refresh counter 334, ZQCal counter 336, and power down counter 338. In one embodiment, test engine 370 performs a reset of memory controller 330 in conjunction with a memory test. The reset can include resetting all counters of memory controller 330, or can include selectively resetting certain counters.

Refresh counter 334 represents a counter that controls timing for performing a refresh of one or more memory resource of memory device 310. ZQCal counter 336 represents a counter that controls a configuration of a termination resistor. Power down counter 338 represents a counter that controls timing related to a power down event. It will be understood that not only could there be other counters, there can be multiples of each counter type (e.g., multiple power down counters).

In one embodiment, test engine 370 provides reset control of refresh counter 334 via test event 384, control of ZQCal counter 336 via test event 386, and control of power down counter 338 via test event 388. It will be understood that each of test events 384, 386, and 388 could be the same test event. For example, test engine 370 could generically reset all counters when it is to reset one counter for a specific memory test. Test events 384, 386, and 388 could be signals provided directly from test engine 370. In one embodiment, one or more test events 384, 386, and 388 are signal provided by scheduler 332. Both test engine 370 and scheduler 332 can generate test events based on test synchronization requirements and ease of implementation.

Generally resetting of a counter is thought of as resetting the counter to zero. In one embodiment, one or more of the counter are reset to a programmable reset value specific to the counter and/or specific to a particular test or test event. Thus, reset value 354 is shown as an input to refresh counter 334, reset value 356 is shown as an input to ZQCal counter 336, and reset value 358 is shown as an input to power down counter 338. It will be understood that reset values 354, 356, and 358 could alternatively be replaced with programmable delays on a corresponding test event signal (test events 384, 386, and 388, respectively). Thus, if specific test event signals are used for the different counters, test engine 370 could simply control when a reset is generated for a specific counter to produce a desired value at a specific point in the test. Alternatively, the counter can be reset and then set to a specific non-zero counter value.

Figure 4:
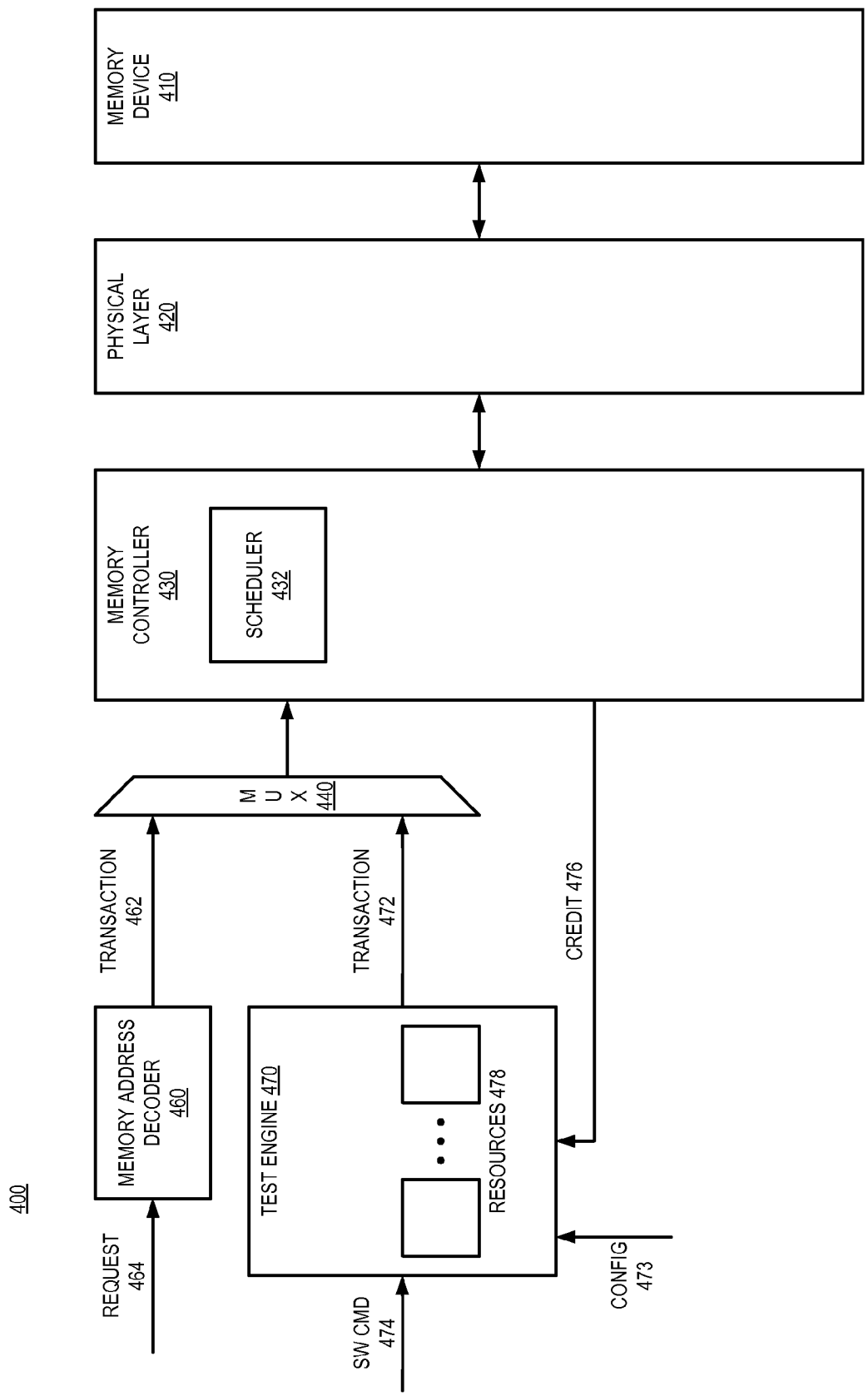
FIG. 4 is a block diagram of an embodiment of a system having a test engine with configurable hardware resources that provides transaction-level testing.

FIG. 4 is a block diagram of an embodiment of a system having a test engine with configurable hardware resources that provides transaction-level testing. System 400 is one example of an embodiment of a system with a test engine in accordance with any embodiment described herein, such as systems 100, 200, or 300. Memory device 410 stores data and/or instructions for execution by a processor. The operation of memory device 410 is tested by test engine 470.

System 400 includes memory device 410, physical layer 420, memory address decoder 460, and test engine 470. Each component corresponds to a component of system 200, and the description above with respect to those components applies to system 400. In one embodiment, system 400 includes mux 440, which can be the same as mux 240 of system 200 discussed above. Memory address decoder 460 receives request 464, and generates transaction 462 in response to the request, where transaction 462 includes specific address information. Test engine 470 receives software command 474, and in response to the instruction generates one or more transactions 472. In one embodiment, system 400 utilizes credit 476 to provide feedback from memory controller 430 to test engine 470.

Memory controller 430 includes scheduler 432, which can be similar to scheduler 232 of system 200. Memory controller 430 can use credit 476 to provide indicators of the timing of processing transaction 472, and for example, can indicate when a transaction has been processed.

In one embodiment, test engine 470 includes dynamically configurable hardware resources 478. For example, in one embodiment, test engine 470 includes one or more configurable/programmable logic arrays or configurable logic devices. It will be understood that configurable/programmable logic devices can be configured via software control. As mentioned above, the software control can be through a local device, or via a remote administration device. Thus, in one embodiment, configuration (config) 473 is provided by the test source that generates software command 474. In one embodiment, configuration 473 represents a setting of one or more registers or configuration controls in test engine 470, and software logic to program test engine resources 478 can come from a storage device (not shown).

Resource 478 can be used to implement any of a number of different tests, and the configuration of the resources can be different for the different tests, although some configuration settings may overlap between tests. In one embodiment, resources 478 are arranged to implement different FSMs in response to configuration 473.

As discussed in more detail below, test engine 470 performs iterative testing in accordance with a standard testing notation, such as van de Goor's notation. In the iterative testing, test engine 470 identifies an address range of memory device 410 through which to iterate the test transactions. Test engine 470 generates transactions as a sequence of transaction, which can include the same command or set of commands, with different addresses to test the entire range. Thus, each transaction in a sequence can resolve to one or more memory device commands with different physical addresses, which are scheduled in sequence by memory controller 430 and executed by memory device 410.

Figure 5:
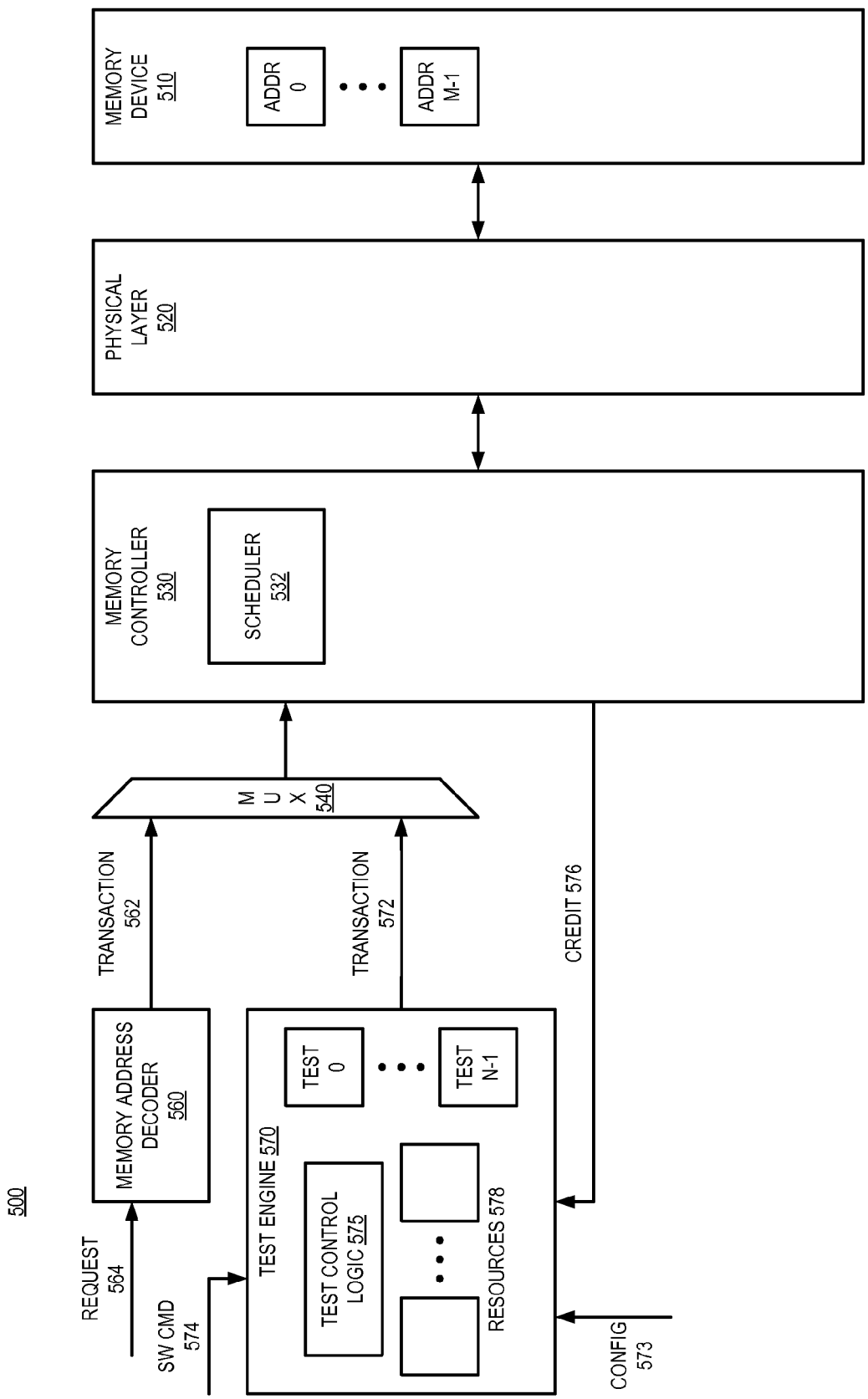
FIG. 5 is a block diagram of an embodiment of a system having a test engine with configurable hardware resources that can provide parallel test transactions.

FIG. 5 is a block diagram of an embodiment of a system having a test engine with configurable hardware resources that can provide parallel test transactions. System 500 provides one example of a system in accordance with system 400 of FIG. 4. The descriptions of memory device 510, physical layer 520, memory controller 530, scheduler 532, mux 540, memory address decoder 560, request 564, transaction 562, and credit 576 are similar to those of elements in system 400 with similar identifiers (e.g., memory device 510 corresponds to memory device 410, and so forth). Memory device 510 is more explicitly shown having memory elements (e.g., cells) with addresses ADDR0 through ADDR(M−1). The M addresses could be the range of all addresses in memory device 510, or alternatively could be a range less than the whole device over which a test sequence is to be iterated.

Test engine 570 is shown to include test0 through test(N−1). The N tests can represent different iterations through the same test (e.g., the same test transaction with N different addresses), in which case N and M could be considered equal. The N tests can represent N different tests that are each iterated through the M addresses. As illustrated, test engine 570 includes N different configurations of resources 578 to execute the N different tests. Configuration 573 is provided to configure the N different test setups of resources 578. In one embodiment, a single software command 574 operates to cause test engine 570 to generate M transaction 574 to iteratively test ADDR0 through ADDR(M−1).

In one embodiment, the address range M can be decomposed further into {Rank[Ra-1:0], Bank[B-1:0], Row[R-1:0], Column[C-1:0]} starting and stopping addresses for a test, where the rank, bank, row, and column are understood to be of sizes Ra, B, R, and C, respectively. It will be understood that hardware can adjust the Row/Column range based on exact organization for each rank of memory device 510 (e.g., a 2 Gb DRAM will have a different number of rows than a 4 Gb DRAM). It will be understood that hardware can adjust the range of the rank based on the system population (e.g., a system could be populated with single rank or quad rank DIMMs). In one embodiment, test engine 570 includes test control logic 575, which represents logic that enables test engine to modify its configuration based on configuration signal 573. Test control logic 575 manages the configuration of resources 578.

The setting value of {Rank, Bank, Row, Column} indicate specific addresses. In one embodiment, the addresses can be incremented by Rate and Value, which could each be signed numbers. In one embodiment, test engine 570 includes address increment logic (e.g., implemented in resources 578. The address increment logic can support various options. In one embodiment, test engine 570 via address increment logic can generate a test sequence where every Rate transactions, the address is incremented by Value. In one embodiment, test engine 570 via address increment logic can generate a test sequence where every Rate subsequences, the address is incremented by Value. In one embodiment, test engine 570 via address increment logic can generate a test sequence where a wrap on one subfield of the address can cause an increment on a different subfield. For example, when column reaches its stop point and wraps around, it could cause the row to increment. This can also be done in multiple dimensions to allow for more complex tests that walk along diagonals (for example, simultaneously incrementing both row and column).

In one embodiment, test engine 570 periodically inverts {Rank, Bank, Row, Column} at a programmable rate to stress the decoding logic of memory device 520 (e.g., decoding logic in physical layer 520). A test sequence can indicate a list of Subsequences enabled for a particular test, and a number of times to loop through the Subsequences. In one embodiment, test engine 570 includes logic to determine whether to use a fixed number of transactions, or base sequence transition on an address wrap.

In one embodiment, test engine 570 increments the {Rank, Bank, Row, Column} in a way that the address changes in a pseudo random fashion instead of a simple linear fashion while still covering the entire address range. In one embodiment, the counter could be replaced with a linear feedback shift register of the appropriate length to randomly change all the address bits on each increment. In another embodiment, more sophisticated random number generators could be utilized to provide better coverage of a wide variety of defects with a single test.

In one embodiment, a Subsequence defines how many transactions the Subsequence should perform. The Subsequence can also define what type of transaction the Subsequence should do, such as Base Read, Base Write, Base Read followed by a Write, Base Write followed by a Read, Offset Read, Offset Write, or other transaction type. A "Base" transaction refers to a transaction performed with respect to a current (i.e., base) address with no offsets applied (e.g., a Base Read is a Read from the current address without offset). An "Offset" transaction refers to a transaction performed by applying a signed offset to the current (i.e., base) address (e.g., an Offset Read is a Read from the address: Current Address+(signed)Offset). In one embodiment, test engine 570 can generate one or more offset transactions, which apply an offset to a current {Rank, Bank, Row, Column} address. The offset can enable tests that stress the memory device cell at the current address by accessing nearby cells. For example, test engine 570 can apply a range of different offsets where the test will read all memory addresses within ±X rows of the current address. In one embodiment, test engine 570 can apply offsetting to multiple dimensions of the address, allowing for accesses within a programmable-sized hypercube of the current address.

It will be understood that test engine 570 can generate inverted data transactions based on a number of transactions or certain bits of the address. The use of inverted data transactions provides a simple way to create stripes or checkerboard data patterns useful in memory tests.

The following example illustrates one embodiment of how test engine 570 could execute a portion of a test based on the van de Goor instruction ^(rd,wi). Assume that sequence setup was set with: start address={0,0,0,0}, and stop address={MaxRank, MaxBank, MaxRows, MaxCols}. In this case, MaxRank, MaxBank, MaxRows, and MaxCols represent values indicating the highest value for each of those fields. The van de Goor notation ('^') indicates incrementing from zero up to the maximum address. Thus, test engine 570 will increment the address. In one embodiment, the test in configured to propagate carries from Cols->Rows->Bank->Rank. With such a setup, the test engine can end the test when Rank wraps around. Test engine 570 can be configured to run two subsequences. SubSequence0 can be set up to do Read with non-inverted data, and SubSequence1 can be set up to do Write with inverted data. It will be understood that this is one very simple test that reads data out, and writes back the inverted data, incrementing up through all selected addresses.

In another example, which could be an extension of the previous example, the test engine can generate a cell retention test. The cell retention test can be accomplished by breaking the test into a series of X sequences with write and read subsequences that walk through Y addresses each, where Y*X=M. Walking through all of memory ADDR[0:M−1] can be accomplished by doing:

| | |
|---|---|
| Seq0/Subseq0 | Write ADDR[0:Y−1] |
| Seq0/Subseq1 | Read ADDR[0:Y−1] |
| Seq1/Subseq0 | Write ADDR[Y:2Y−1] |
| Seq1/Subseq1 | Read ADDR[Y:2Y−1] |
| ... | |
| SeqY−1/Subseq0 | Write ADDR[(Y−1)*X:M−1] |
| SeqY−1/Subseq1 | Read ADDR[(Y−1)*X:M−1] |

Based on knowing how long a write/read operation requires, a test administrator can set the value of Y to precisely control how long a cell must retain its value before the read occur. In one embodiment, this test has the ability for subsequences to either save or restore the current address state at different points during the test, which allows Seq1 to pick up where Seq0 left off. Many other test examples are possible.

Figure 6:
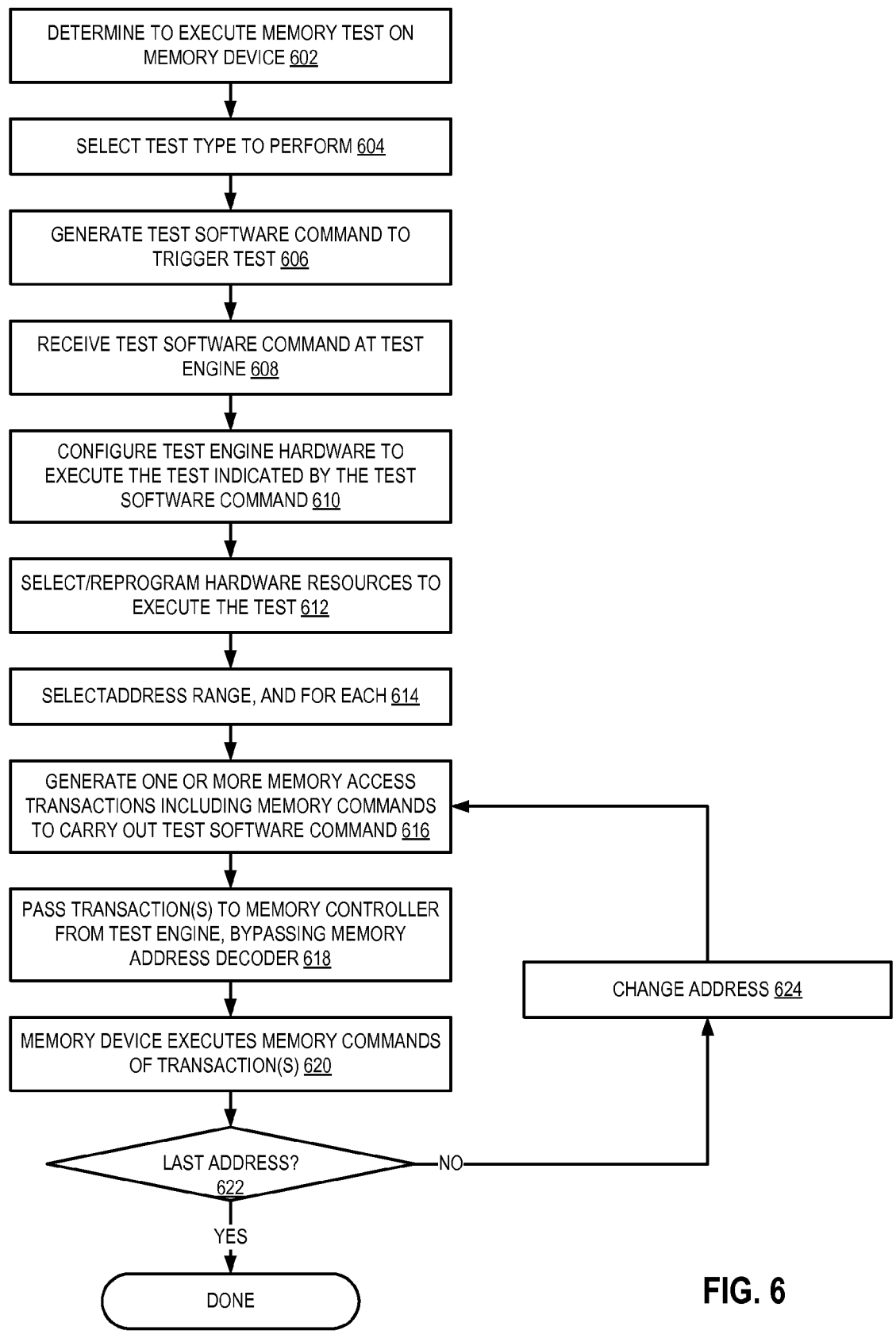
FIG. 6 is a flow diagram of an embodiment of a process for testing a memory device.

FIG. 6 is a flow diagram of an embodiment of a process for testing a memory device. A memory source determines to perform a memory test on a memory device, 602. Reasons and circumstances for testing a memory device are set out above, and will not be repeated in detail here. Additionally, types of potential test sources are identified above, and the test source here is assumed to be of a similar type as discussed previously. In one embodiment, the test source selects a type of test to perform, 604. In one embodiment, the test includes an instruction by the test source indicating a standard notation test to execute, such as a van de Goor's notation instruction. The test type can be a single van de Goor's parenthetical statement.

The test source generates a test software command or instruction to send to the test engine to trigger the selected test, 606. The test engine receives the test software command, 608. In one embodiment, the test source generates one or more signals that configure the test engine hardware to execute the selected test, 610. In one embodiment, the test engine configures itself in response to the test software command.

Configuration can include preparing the hardware and selecting the proper hardware to execute the test. In one embodiment, configuring the test engine hardware includes reprogramming the hardware resources of the test engine. An alternative is to include more hardware, which would reduce how much the test engine needs to be reprogrammed. In one embodiment, the test engine includes hardware to execute an instruction received, and the hardware resources are selected rather than reprogrammed. In one embodiment, some of the hardware resources are reprogrammed, and alternatively all of the hardware resources are selected. The configuration can be directed from the test engine itself by accessing a programming source (e.g., configuration stored on a device), or can be programmed by the test source. Thus, the hardware resources are selected and/or programmed to execute the test, 612.

The test engine selects an address range, either by its own determination, or by being provided the address range from the test source, 614. The test engine iterates through the test for each of the addresses. For each iteration, the test engine generates one or more memory access transactions to pass to the memory controller in response to receiving the test software command to carry out the test, 616. The memory access transactions can include memory command identifiers to carry out the test software command, as well as a specific address location.

The test engine passes the transaction or sequence of transactions to the memory controller to cause the memory controller to schedule the transactions, 618. The test engine bypasses a memory address decoder when passing the transaction(s) to the memory controller. The memory controller generates and schedules specific memory device commands corresponding to the transaction(s), and the memory device executes the memory device commands to carry out the transaction(s), 620.

If the address is the last address in the address range, 622 YES branch, the test engine can end the test. If the address is not the last address in the address range, 622 NO branch, the test engine adjusts the address, 624, and repeats 616, 618, 620 with the adjusted address. As mentioned previously, the address adjustment can be incrementing the address, decrementing the address, or restoring the address from a previously saved intermediate state. In one embodiment, the address adjustment can include address inverting. It will be understood that the iteration illustrated is representative of the iterative nature of the testing. As explained previously, there could be iterations of inner and outer loops with sequences and subsequences to implement the testing.

Figure 7:
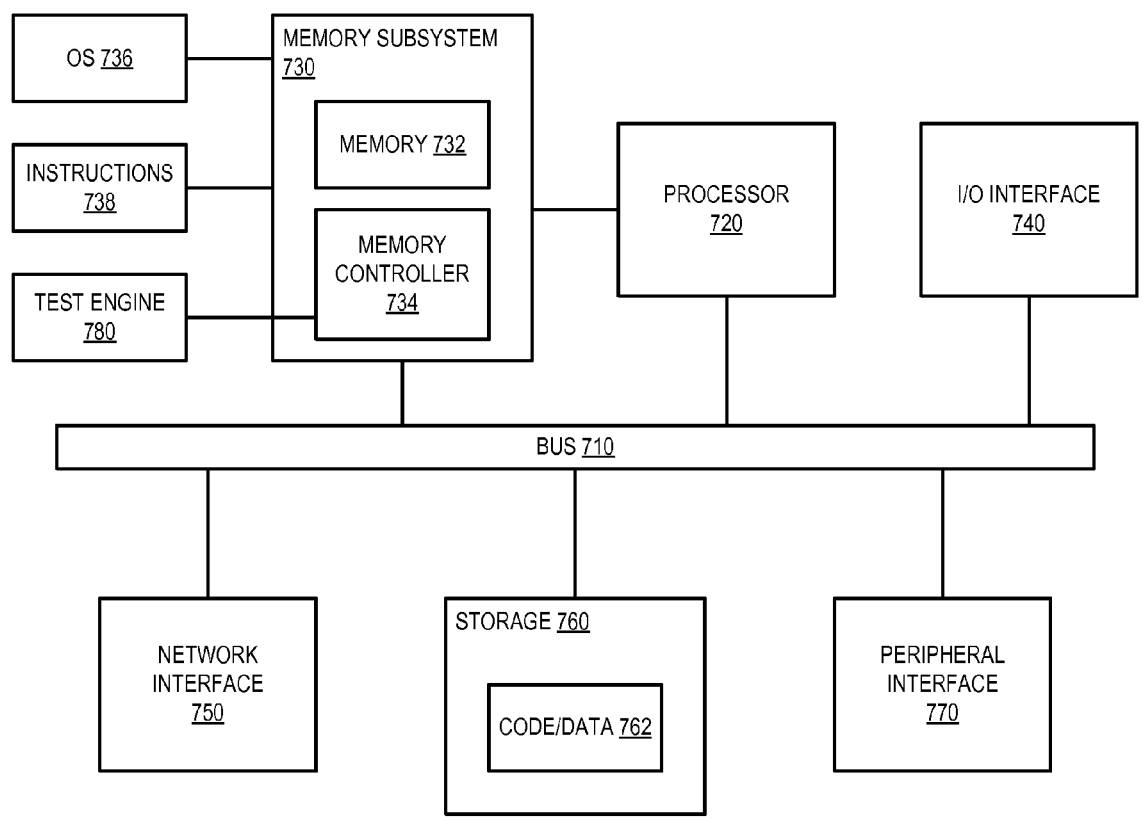
FIG. 7 is a block diagram of an embodiment of a computing system in which transaction-level memory device testing can be implemented.

FIG. 7 is a block diagram of an embodiment of a computing system in which transaction-level memory device testing can be implemented. System 700 represents a computing device in accordance with any embodiment described herein, and can be a laptop computer, a desktop computer, a server, a gaming or entertainment control system, a scanner, copier, printer, routing or switching device, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 includes memory device 732 where it stores data, instructions, programs, or other items. In one embodiment, memory subsystem includes memory controller 734, which is a memory controller in accordance with any embodiment described herein, and which includes a scheduler to generate and issue commands to memory device 732.

In one embodiment, system 700 includes test engine 780, which provides memory test transactions to memory controller 734 to have memory controller 734 schedule the transactions in order to provide deterministic testing. Thus, test engine 780 enables transaction-level memory testing of memory 732 in accordance with any embodiment described herein.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

Figure 8:
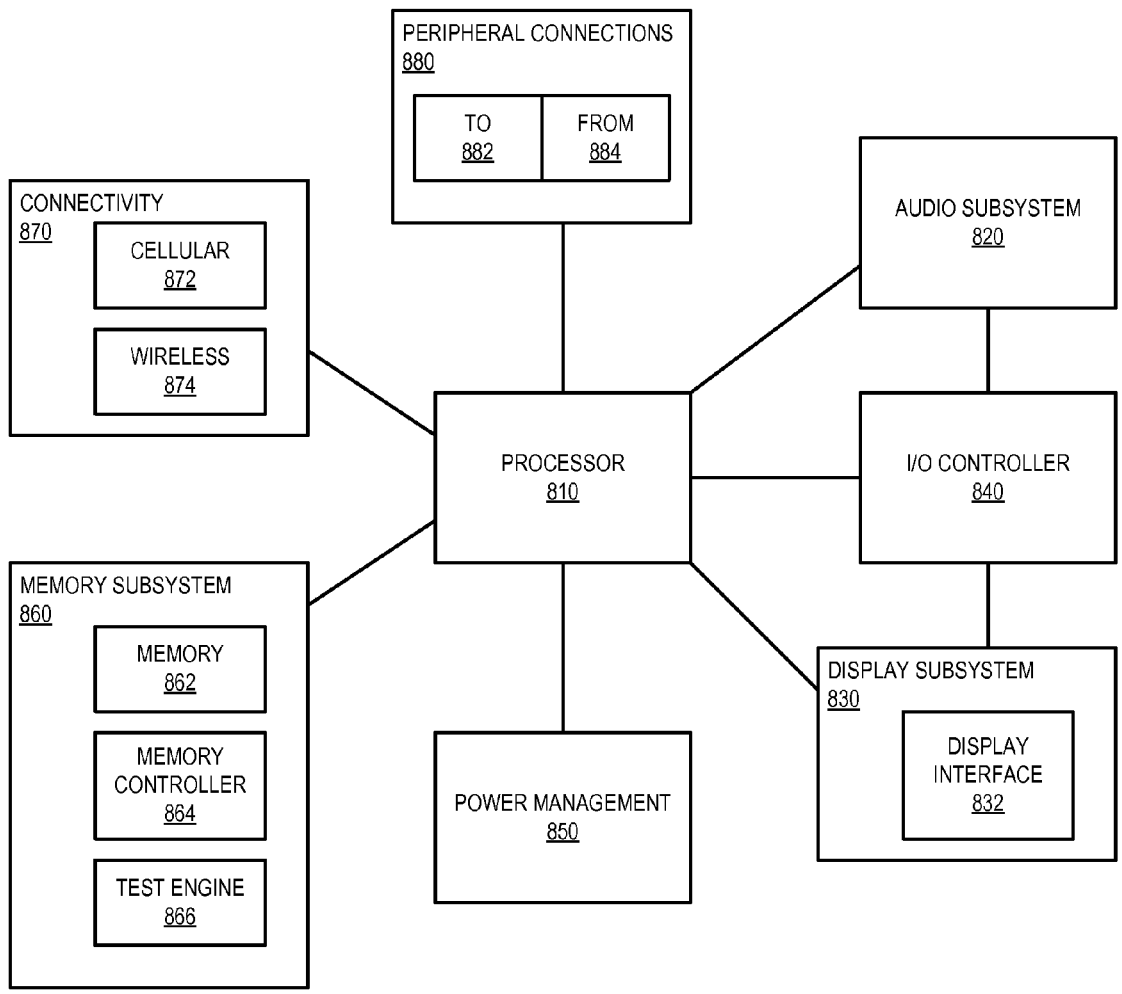
FIG. 8 is a block diagram of an embodiment of a mobile device in which transaction-level memory device testing can be implemented.

FIG. 8 is a block diagram of an embodiment of a mobile device in which transaction-level memory device testing can be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. In one embodiment, processor 810 includes optical interface components in addition to a processor die. Thus, the processor die and photonic components are in the same package. Such a processor package can interface optically with an optical connector in accordance with any embodiment described herein.

The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800.

In one embodiment, memory subsystem 860 includes memory controller 864 (which could also be considered part of the control of system 800, and could potentially be considered part of processor 810). Memory controller 864 includes a scheduler to generate and issue commands to memory device 862. In one embodiment, memory subsystem 860 includes test engine 866, which provides memory test transactions to memory controller 864 to have memory controller 864 schedule the transactions in order to provide deterministic testing. In one embodiment, test engine 866 is outside memory subsystem 860 and coupled to it. Thus, test engine 866 enables transaction-level memory testing in memory subsystem 860 in accordance with any embodiment described herein.

Connectivity 870 includes hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a method includes receiving, by a test engine, a memory test software instruction indicating a test to perform on a memory device; selecting hardware of the test engine to execute the test; identifying a range of addresses through which to iterate a test sequence to execute the test; and for each iteration of the test sequence to cover the range of addresses, generating a memory access transaction; determining a specific physical address in the address range; and sending the memory access transaction with the specific physical address, bypassing a memory address decoder associated with a memory controller of the memory device, to cause the memory controller to generate and schedule memory device commands for the memory device to execute to carry out the transaction.

In one embodiment, receiving the memory test software instruction comprises receiving an instruction from a basic input/output system (BIOS). In one embodiment, receiving the memory test software instruction comprises receiving an instruction that complies with van de Goor's notation. In one embodiment, selecting the hardware of the test engine comprises dynamically reprogramming hardware resources of the test engine. In one embodiment, the memory test includes multiple test sequences, each iterated through the selected address range, and wherein reprogramming the hardware resources of the test engine comprises configuring the hardware resources prior to each test sequence. In one embodiment, identifying the range of addresses comprises identifying all addresses in the memory device. In one embodiment, identifying the range of addresses further comprises specifying an order of address incrementing for each iteration.

In one embodiment, identifying the range of addresses further comprises specifying a rate of address incrementing for each iteration. In one embodiment, identifying the range of addresses further comprises specifying a specific start address and a specific stop address. In one embodiment, generating the memory access transaction comprises generating a command plus specific memory location address information. In one embodiment, generating the command comprises generating a read command identifier or a write command identifier. In one embodiment, the method further includes saving an intermediate copy of an address during an iteration of the test sequence, and wherein determining the specific physical address comprises restoring a saved intermediate copy of an address. In one embodiment, determining the specific physical address comprises computing an address as a base address plus an offset. In one embodiment, computing the address as a base address plus an offset comprises computing an address for performing a test of a programmable size hypercube. In one embodiment, determining the specific physical address comprises performing address inversion. In one embodiment, determining the specific physical address comprises performing random address incrementing.

In one aspect, a memory subsystem includes a memory device to store data and execute memory device commands to access and manage the data; a memory controller coupled to the memory device to issue the memory device commands, the memory controller including a scheduler that determines an order in which to send the memory device commands to the memory device; and test engine hardware coupled to the memory controller, the coupling to bypass a memory address decoder of the memory controller, wherein the test engine hardware is to identify a range of addresses through which to iterate a test sequence to execute a test in response to a test software instruction indicating a test to perform on the memory device, and for each iteration of the test sequence to cover the range of addresses, generate a memory access transaction, determine a specific physical address in the address range, and send the memory access transaction with the specific physical address to cause the memory controller to generate schedule memory device commands for the memory device to execute to carry out the transaction.

In one embodiment, the memory subsystem further includes a debug port through which to connect to a remote test administrator processor, wherein the remote test administrator processor is to generate the test software command. In one embodiment, the test engine is to receive an instruction that complies with van de Goor's notation. In one embodiment, the hardware resources of the test engine are reprogrammed to select the hardware. In one embodiment, the test engine is to identify all addresses in the memory device. In one embodiment, the test engine is to generate a command identifier plus specific memory location address information. In one embodiment, the command identifier comprises a read command identifier or a write command identifier.

In one aspect, an electronic device comprising: a memory subsystem having a memory device to store data and execute memory device commands to access and manage the data; a memory controller coupled to the memory device to issue the memory device commands, the memory controller including a scheduler that determines an order in which to send the memory device commands to the memory device; and test engine hardware coupled to the memory controller, the coupling to bypass a memory address decoder of the memory controller, wherein the test engine hardware is to identify a range of addresses through which to iterate a test sequence to execute a test in response to a test software instruction indicating a test to perform on the memory device, and for each iteration of the test sequence to cover the range of addresses, generate a memory access transaction, determine a specific physical address in the address range, and send the memory access transaction with the specific physical address to cause the memory controller to generate and schedule memory device commands for the memory device to execute to carry out the transaction; and a touchscreen display coupled to display memory stored in the memory subsystem. In one embodiment, the electronic further includes a debug port through which to connect to a remote test administrator processor, wherein the remote test administrator processor is to generate the test software command. In one embodiment, the test engine is to receive an instruction that complies with van de Goor's notation. In one embodiment, the hardware resources of the test engine are reprogrammed to select the hardware. In one embodiment, the test engine is to identify all addresses in the memory device. In one embodiment, test engine is to generate a command identifier plus specific memory location address information. In one embodiment, the command identifier comprises a read command identifier or a write command identifier Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
   receiving, by a test engine, a memory test software instruction indicating a test to perform on a memory device;
   selecting hardware of the test engine to execute the test;
   identifying a range of addresses through which to iterate a test sequence to execute the test; and
   for each iteration of the test sequence to cover the range of addresses,
   generating a memory access transaction;
   determining a specific physical address in the address range; and
   sending the memory access transaction with the specific physical address, bypassing a memory address decoder associated with a memory controller of the memory device, to cause the memory controller to generate and schedule memory device commands for the memory device to execute to carry out the transaction.

2. The method of claim 1, wherein receiving the memory test software instruction comprises receiving an instruction from a basic input/output system (BIOS).

3. The method of claim 1, wherein receiving the memory test software instruction comprises receiving an instruction that complies with van de Goor's notation.

4. The method of claim 1, wherein selecting the hardware of the test engine comprises dynamically reprogramming hardware resources of the test engine.

5. The method of claim 4, wherein the memory test includes multiple test sequences, each iterated through the selected address range, and wherein reprogramming the hardware resources of the test engine comprises configuring the hardware resources prior to each test sequence.

6. The method of claim 1, wherein identifying the range of addresses comprises identifying all addresses in the memory device.

7. The method of claim 1, wherein identifying the range of addresses further comprises specifying an order of address incrementing for each iteration.

8. The method of claim 1, wherein identifying the range of addresses further comprises specifying a rate of address incrementing for each iteration.

9. The method of claim 1, wherein identifying the range of addresses further comprises specifying a specific start address and a specific stop address.

10. The method of claim 1, wherein generating the memory access transaction comprises generating a command plus specific memory location address information.

11. The method of claim 10, wherein generating the command comprises generating a read command identifier or a write command identifier.

12. The method of claim 1, further comprising saving an intermediate copy of an address during an iteration of the test sequence, and wherein determining the specific physical address comprises restoring a saved intermediate copy of an address.

13. The method of claim 1, wherein determining the specific physical address comprises computing an address as a base address plus an offset.

14. The method of claim 13, wherein computing the address as a base address plus an offset comprises computing an address for performing a test of a programmable size hypercube.

15. The method of claim 1, wherein determining the specific physical address comprises performing address inversion.

16. The method of claim 1, wherein determining the specific physical address comprises performing random address incrementing.

17. A memory subsystem comprising:
   a memory device to store data and execute memory device commands to access and manage the data;
   a memory controller coupled to the memory device to issue the memory device commands, the memory controller including a scheduler that determines an order in which to send the memory device commands to the memory device; and
   test engine hardware coupled to the memory controller, the coupling to bypass a memory address decoder of the memory controller, wherein the test engine hardware is to identify a range of addresses through which to iterate a test sequence to execute a test in response to a test software instruction indicating a test to perform on the memory device, and for each iteration of the test sequence to cover the range of addresses, generate a memory access transaction, determine a specific physical address in the address range, and send the memory access transaction with the specific physical address to cause the memory controller to generate and schedule memory device commands for the memory device to execute to carry out the transaction.

18. The memory subsystem of claim 17, further comprising a debug port through which to connect to a remote test administrator processor, wherein the remote test administrator processor is to generate the test software command.

19. The memory subsystem of claim 17, wherein the test engine is to receive an instruction that complies with van de Goor's notation.

20. The memory subsystem of claim 17, wherein the hardware resources of the test engine are reprogrammed to select the hardware.

21. The memory subsystem of claim 17, wherein the test engine is to identify all addresses in the memory device.

22. The memory subsystem of claim 17, wherein the test engine is to generate a command identifier plus specific memory location address information.

23. The memory subsystem of claim 22, wherein the command identifier comprises a read command identifier or a write command identifier.

24. An electronic device comprising:
a memory subsystem having
  a memory device to store data and execute memory device commands to access and manage the data;
  a memory controller coupled to the memory device to issue the memory device commands, the memory controller including a scheduler that determines an order in which to send the memory device commands to the memory device; and
  test engine hardware coupled to the memory controller, the coupling to bypass a memory address decoder of the memory controller, wherein the test engine hardware is to identify a range of addresses through which to iterate a test sequence to execute a test in response to a test software instruction indicating a test to perform on the memory device, and for each iteration of the test sequence to cover the range of addresses, generate a memory access transaction, determine a specific physical address in the address range, and send the memory access transaction with the specific physical address to cause the memory controller to generate and schedule memory device commands for the memory device to execute to carry out the transaction; and
a touchscreen display coupled to display memory stored in the memory subsystem.

25. The electronic device of claim 24, further comprising a debug port through which to connect to a remote test administrator processor, wherein the remote test administrator processor is to generate the test software command.

26. The electronic device of claim 24, wherein the test engine is to receive an instruction that complies with van de Goor's notation.

27. The electronic device of claim 24, wherein the hardware resources of the test engine are reprogrammed to select the hardware.

28. The electronic device of claim 24, wherein the test engine is to identify all addresses in the memory device.

29. The electronic device of claim 24, wherein the test engine is to generate a command identifier plus specific memory location address information.

30. The electronic device of claim 29, wherein the command identifier comprises a read command identifier or a write command identifier.

* * * * *